US012750955B2

(12) United States Patent
Zhao et al.

(10) Patent No.: US 12,750,955 B2
(45) Date of Patent: Sep. 29, 2026

(54) EMBEDDED PACKAGE STRUCTURE AND POWER SUPPLY APPARATUS

(71) Applicant: Huawei Digital Power Technologies Co., Ltd., Shenzhen (CN)

(72) Inventors: Chunyan Zhao, Shanghai (CN); Chao Shen, Shanghai (CN); Kuanming Bao, Shanghai (CN)

(73) Assignee: Huawei Digital Power Technologies Co., Ltd., Shenzhen (CN)

( * ) Notice: Subject to any disclaimer, the term of this patent is extended or adjusted under 35 U.S.C. 154(b) by 314 days.

(21) Appl. No.: 18/477,392

(22) Filed: Sep. 28, 2023

(65) Prior Publication Data

US 2024/0121901 A1 Apr. 11, 2024

(30) Foreign Application Priority Data

Oct. 8, 2022 (CN) ......................... 202211223771.8

(51) Int. Cl.
*H05K 1/185* (2026.01)
*H10W 40/25* (2026.01)
(Continued)

(52) U.S. Cl.
CPC .......... *H05K 1/186* (2013.01); *H10W 40/258* (2026.01); *H10W 70/611* (2026.01); *H10W 70/685* (2026.01); *H05K 2201/10015* (2013.01); *H05K 2201/10022* (2013.01); *H05K 2201/1003* (2013.01)

(58) Field of Classification Search
CPC .......... H05K 1/02; H05K 1/0233; H05K 1/18; H05K 1/181–187; H05K 2201/1006; H05K 2201/10015; H05K 2201/10022; H05K 2201/1003; H01L 23/36; H01L 23/50; H01L 23/3736; H01L 23/5389; H10W 40/258; H10W 40/10; H10W 70/611; H10W 70/685; H10W 70/614
USPC ........ 361/760–766, 783–784, 790, 792–795; 257/686–690
See application file for complete search history.

(56) References Cited

U.S. PATENT DOCUMENTS 5,353,498 A * 10/1994 Fillion ................ H10W 74/019 257/E23.092
5,384,434 A * 1/1995 Mandai ............... H01L 23/5383 174/250

(Continued)

FOREIGN PATENT DOCUMENTS

CN 104425465 A 3/2015
CN 113451259 A 9/2021

(Continued)

*Primary Examiner* — Tuan T Dinh
(74) *Attorney, Agent, or Firm* — Slater Matsil, LLP

(57) ABSTRACT

This application provides an embedded package structure and a power supply apparatus. First electronic components with smaller sizes are stacked, and then arranged in a substrate frame in a two-dimensional manner with a larger-size inductor component to form an embedded package structure. This can reduce an area occupied by the entire embedded package structure, and reduce an overall size of the structure, thereby facilitating integration and miniaturization. Then, a chip is disposed on the embedded package structure, so that the chip serving as a main heat source is placed on a surface of the power supply apparatus.

19 Claims, 8 Drawing Sheets

(51) Int. Cl.
*H10W 70/60* (2026.01)
*H10W 70/685* (2026.01)

(56) References Cited

U.S. PATENT DOCUMENTS

| | | | | | |
|---|---|---|---|---|---|
| 6,021,050 | A * | 2/2000 | Ehman | H05K 1/165 | 428/209 |
| 6,038,133 | A * | 3/2000 | Nakatani | G06F 16/958 | 428/209 |
| 6,975,516 | B2 * | 12/2005 | Asahi | H01L 21/6835 | 361/764 |
| 7,738,256 | B2 * | 6/2010 | Sawatari | H10W 70/614 | 361/761 |
| 7,885,081 | B2 * | 2/2011 | Kawagishi | H01L 24/24 | 361/764 |
| 8,872,041 | B2 * | 10/2014 | Lee | H05K 1/186 | 174/250 |
| 8,890,628 | B2 * | 11/2014 | Nair | H05K 1/185 | 257/416 |
| 9,078,370 | B2 * | 7/2015 | Sugiyama | H05K 1/16 | |
| 9,107,290 | B1 * | 8/2015 | Chen | H01L 25/074 | |
| 10,321,575 | B2 | 6/2019 | Li et al. | | |
| 2003/0057544 | A1 * | 3/2003 | Nathan | H10W 70/614 | 257/E29.022 |
| 2009/0225525 | A1 * | 9/2009 | Mano | H01F 41/046 | 361/760 |
| 2011/0203836 | A1 * | 8/2011 | Yokota | H05K 1/183 | 174/250 |
| 2019/0189583 | A1 | 6/2019 | Baek et al. | | |
| 2020/0364600 | A1 * | 11/2020 | Elsherbini | B82Y 10/00 | |
| 2022/0013444 | A1 | 1/2022 | Kim et al. | | |

FOREIGN PATENT DOCUMENTS

| | | | |
|---|---|---|---|
| EP | 3806330 | A1 | 4/2021 |
| GB | 2197540 | A | 5/1988 |

* cited by examiner

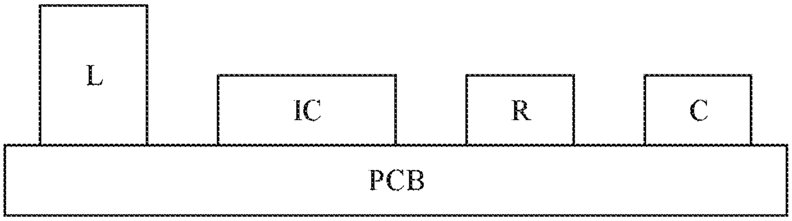
(PRIOR ART) FIG. 1a
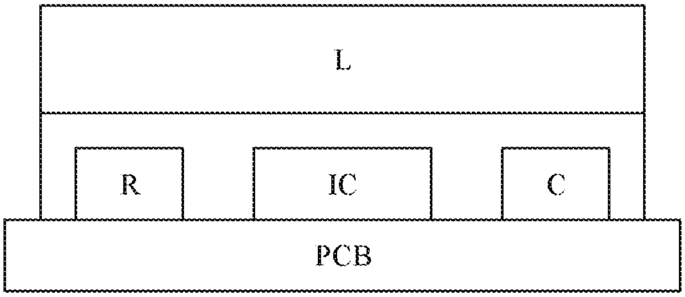
(PRIOR ART) FIG. 1b
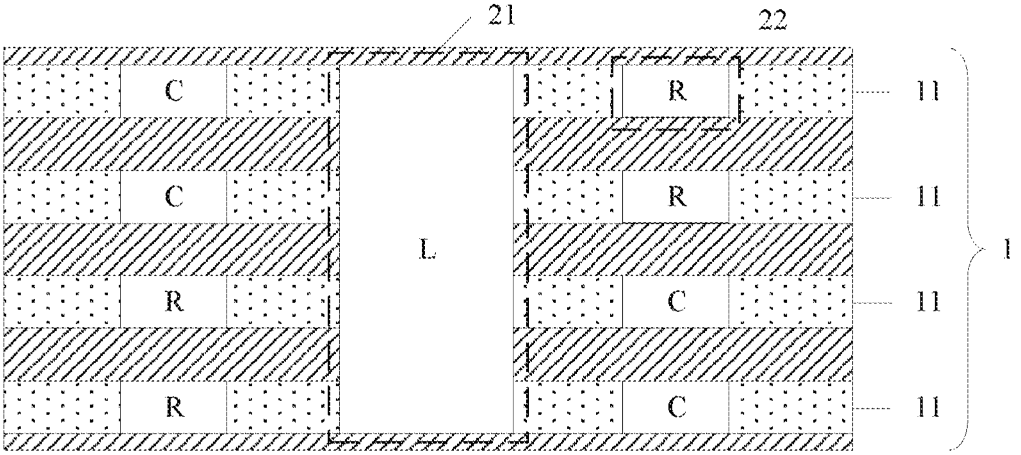
FIG. 2

EMBEDDED PACKAGE STRUCTURE AND POWER SUPPLY APPARATUS

CROSS-REFERENCE TO RELATED APPLICATION

This application claims priority to Chinese Patent Application No. 202211223771.8, filed on Oct. 8, 2022, which is hereby incorporated by reference in its entirety.

TECHNICAL FIELD

The present invention relates to the field of electronic component packaging technologies, and in particular, to an embedded package structure, a power supply apparatus, and an electronic device.

BACKGROUND

With development of electronic products towards miniaturization, portability, and multifunctionality, an embedded component packaging (Embedded Component Packaging, ECP) technology has become a research hotspot in the field of electronic component packaging technologies. ECP is a package form in which electronic components such as a capacitor, a resistor, and a chip are embedded in a substrate. As ECP can shorten a link path between the components, reduce a transmission loss, improve product integration, reduce outline dimensions of a module, and improve reliability and electro-thermal performance of a product, ECP is an important means of achieving multifunctionality and high performance of a portable electronic device.

The ECP technology can be used in structure design of a power module. Currently, in design of a power module, electronic components are embedded side by side in the substrate. Such design is suitable for a power module with a small or medium power and a small or medium current. With digital development of society, a current of a required power supply module is increasingly large, and a size of an inductor required in the power module is increasingly large. A previous structure design for a power module with small or medium power and small or medium current cannot meet a requirement of a high-current power module for a small occupied area and high heat dissipation.

SUMMARY

This application provides an embedded package structure, a power supply apparatus, and an electronic device, to reduce an occupied area of ECP and improve a heat dissipation capability.

According to a first aspect, an embodiment of this application provides an embedded package structure. The structure specifically includes: a substrate frame, an inductor component embedded in the substrate frame, and a plurality of stacked first electronic components that are embedded in the substrate frame. The inductor component and the plurality of stacked first electronic components may be embedded in different positions of the substrate frame. It may be considered that the inductor component and the plurality of stacked first electronic components are tiled or arranged in a two-dimensional manner. A thickness of the inductor component is generally greater than a thickness of any one of the plurality of first electronic components. The first electronic component is a passive electronic component. Any one of the plurality of first electronic components may be specifically a capacitor component or a resistor component.

As a power module requires a larger power supply current, a size of the inductor component that needs to be used in the embedded package structure is also far greater than a size of the capacitor component and a size of the resistor component. Specifically, the thickness of the inductor component may be greater than a thickness of another single electronic component. If the inductor component and another electronic component are tiled in the substrate according to a conventional technology, a large area is occupied, which is not conducive to integration and miniaturization design. Therefore, in the embedded package structure provided in this application, the first electronic components with smaller sizes are stacked, and then arranged in the substrate frame in a two-dimensional manner with the larger-size inductor component. Alternatively, it may be considered that the stacked first electronic components with small sizes are placed in a gap of the larger-size inductor component. This can reduce an area occupied by the entire embedded package structure, and reduce an overall size of the structure, thereby facilitating integration and miniaturization.

In some possible implementations of this application, the embedded package structure may include one or more capacitor components and one or more resistor components, or the embedded package structure may include only a plurality of capacitor components, or the embedded package structure may include only a plurality of resistor components. This is not limited herein.

In some possible implementations of this application, there may be a plurality of component groups in the embedded package structure. One component group includes a group of a plurality of stacked first electronic components. Projections in a horizontal direction of the first electronic components included in the component group overlap with each other. During actual application, a quantity and a position of the component group are not limited. In addition, the plurality of stacked first electronic components in one component group may be of a same type, for example, a plurality of resistor components may be stacked to form one component group. Alternatively, the plurality of stacked first electronic components in one component group may be of different types. For example, refer to the figure. Two capacitor components and two resistor components may be stacked to form one component group.

In some possible implementations of this application, the substrate frame may specifically include a plurality of stacked line layers. In other words, the substrate frame may be formed by stacking the plurality of line layers. A dielectric layer may be disposed between adjacent line layers. Each line layer may have a same thickness as or different thickness from another line layer. This is not limited herein. A circuit trace may be provided on the line layer, and some circuit traces may be connected to the first electronic component. Through the line layer, a quantity of external trace layers of the embedded package structure may be reduced, thereby reducing an overall height of the power module. The plurality of stacked line layers may have first through holes that penetrate all the line layers, and the inductor component may be embedded in the first through holes. The plurality of stacked line layers may further have a second through hole that penetrates one line layer. The plurality of stacked first electronic components may include a first-size electronic component, and the first-size electronic component is embedded in the second through hole. The first-size electronic component refers to a first electronic component whose thickness roughly matches a thickness of a line layer in which the first-size electronic component is to be embedded, so that the first-size electronic component can be embedded in the second through hole in the single line layer. The first-size electronic component may be specifically a resistor component or a capacitor component. This is not limited herein. A quantity of line layers included in the substrate frame is determined by the thickness of the inductor component. In other words, a total thickness of the stacked line layers is generally approximately equal to the thickness of the inductor component. A total thickness of a plurality of stacked first electronic components in one component group may also be approximately equal to the thickness of the inductor component. For example, when the substrate frame includes four stacked line layers, the first through hole for embedding the inductor component penetrates the four line layers, two second through holes are disposed in each line layer, and a capacitor component or a resistor component is embedded in each through hole.

In some possible implementations of this application, the plurality of stacked lines may further have a third through hole that penetrates at least two adjacent line layers. The plurality of stacked first electronic components may further include a second-size electronic component, the second-size electronic component may be embedded in the third through hole, and a thickness of the second-size electronic component is greater than a thickness of the first-size electronic component. According to an actual design requirement, in the embedded package structure, the first electronic components may have different sizes. For example, capacitor components of different sizes and resistor components of different sizes may exist. A first electronic component of a larger size may be the second-size electronic component. A second through hole using a single line layer cannot be embedded with the second-size electronic component. Therefore, a third through hole that penetrates a plurality of line layers may be provided. For example, refer to the figure. A third through hole that penetrates two line layers may be provided, and a capacitor component and a resistor component of relatively large sizes may be embedded in the third through hole. In this way, in the embedded package structure, depending on different sizes of the disposed first electronic components, there may be a component group including three stacked first electronic components, or there may be a component group including four stacked first electronic components. A larger thickness of the first electronic component indicates a larger quantity of line layers penetrated by the third through hole for embedding a component, and a smaller quantity of first electronic components included in the component group.

In some possible implementations of this application, in the embedded package structure, there may also be a first electronic component, for example, a large-sized capacitor component, whose thickness is close to the thickness of the inductor component. The capacitor component is directly embedded in the substrate frame and is not stacked with another first electronic component.

In some possible implementations of this application, to maximally integrate the electronic components, a second through hole or a third through hole may be disposed at a same position in a vertical direction on the line layers, so that a maximal quantity of first electronic components are stacked in the component group. Alternatively, in some other possible implementations of this application, the second through hole or the third through hole may not be disposed at a specific position of a line layer, that is, no first electronic component is embedded in a line layer in the component group. Some signal interference may be shielded through the line layer. For example, the second through hole is not disposed in a second line layer in the component group on the left in the figure.

In some possible implementations of this application, the embedded package structure may further include a first interconnect line layer located on the substrate frame, and a second interconnect line layer located on a side that is of the substrate frame and that is away from the first interconnect line layer. During specific implementation, the first interconnect line layer and the second interconnect line layer each may include at least one conductive layer, and a circuit trace is provided on the conductive layer. When the first interconnect line layer and the second interconnect line layer each include two or more conductive layers, an insulation dielectric layer is further provided between adjacent conductive layers. A medium via is provided in the insulation dielectric layer to connect circuit traces on the different conductive layers. It should be noted that, a quantity of conductive layers included in each of the first interconnect line layer and the second interconnect line layer is not limited in this application, and may be designed based on an actual requirement.

In some possible implementations of this application, blind vias that penetrate all the line layers may be provided in the substrate frame. Conduction of the first interconnect line layer and the second interconnect line layer may be implemented through the blind vias.

In the embodiment of this application, through the first interconnect line layer and the second interconnect line layer, the inductor component and the first electronic components embedded in the substrate frame may be led out and connected to components located outside the embedded package structure.

Specifically, one end of a winding of the inductor component embedded in the substrate frame may be electrically connected to the first interconnect line layer, and the other end of the winding of the inductor component may be electrically connected to the second interconnect line layer. The winding of the inductor component is directly conducted with the first interconnect line layer and the second interconnect line layer, so that a current flowing through the inductor component can directly flow from top to bottom through the winding, and a current path is perpendicular to the substrate frame. This greatly shortens the current path.

Specifically, in the plurality of stacked first electronic components, a first electronic component stacked on a top layer may be directly electrically connected to the first interconnect line layer, a first electronic component stacked on a bottom layer may be directly electrically connected to the second interconnect line layer, and a first electronic component stacked on a middle layer may be electrically connected to the first interconnect line layer or the second interconnect line layer through a vertical interconnect component. The vertical interconnect component may be a copper column, or may be another connecting component, which is not limited herein. For example, a middle capacitor component may be electrically connected to the first interconnect line layer through a vertical interconnect component, and a middle resistor component may be electrically connected to the second interconnect line layer through a vertical interconnect component, or vice versa.

In some possible implementations of this application, in the plurality of stacked first electronic components, all the first electronic components may be electrically connected to the first interconnect line layer through different vertical interconnect components, or all the first electronic components may be electrically connected to the second interconnect line layer through different vertical interconnect components.

According to a second aspect, a power supply apparatus provided in this application may specifically include an embedded package structure and at least one second electronic component located on the embedded package structure, where the at least one second electronic component may include at least one chip. In the power supply apparatus provided in this embodiment of this application, an inductor component, a capacitor component, and a resistor component are embedded in the embedded package structure. Then, the chip is disposed on the embedded package structure, so that the chip serving as a main heat source is placed on a surface of the power supply apparatus. Compared with an existing power module structure in which a chip is embedded in a substrate to form an ECP module and an inductor is mounted on a surface of the ECP module, in the embedded package structure provided in this application, a main heat dissipation path of the chip is changed from an existing downward heat dissipation direction to an upward heat dissipation direction, which may improve a heat dissipation capability.

In some possible implementations of this application, the at least one second electronic component may further include at least one capacitor component and/or at least one resistor component. The chip, the capacitor component, and the resistor component that are used as the second electronic components may alternatively be tiled on a surface of the embedded package structure, rather than be stacked.

In this application, the second electronic component may be connected to the embedded package structure in a plurality of manners.

In some possible implementations of this application, the at least one second electronic component may be packaged on the embedded package structure. For example, the chip may be directly flip-packaged (FC) on the first interconnect line layer of the embedded package structure. In addition, when there are a plurality of second electronic components, the second electronic components may be uniformly plastic-packaged. For example, the chip, the capacitor component, and the resistor component may be uniformly plastic-packaged.

In some possible implementations of this application, when there are a plurality of second electronic components, the second electronic component may alternatively be independently plastic-packaged, for example, the chip is independently plastic-packaged.

In some possible implementations of this application, the at least one second electronic component may be first packaged on a first circuit board, and then the first circuit board is electrically connected to the embedded package structure.

In some possible implementations of this application, the at least one second electronic component may be embedded in a second circuit board to form another embedded package structure, and then the second circuit board is electrically connected to the embedded package structure, that is, two ECP structures are interconnected.

In some possible implementations of this application, a heat dissipation module may be further disposed on a surface that is of the at least one chip and that is away from the embedded package structure, namely, a rear side of the chip. The rear side of the chip is connected to the heat dissipation module. Because an area of the chip occupies only 30% to 40% of an area of a voltage apparatus, if heat is dissipated only through an exposed part on the rear side of the chip, a heat dissipation capability is limited. Therefore, the heat dissipation module is disposed to expand a heat dissipation area and improve the heat dissipation capability.

Specifically, the heat dissipation module may be a metal layer covering a packaging surface of the at least one second electronic component. An area of the metal layer is far greater than a surface area of the rear side of the chip. Therefore, a heat dissipation area is expanded, and the heat dissipation capability is improved.

Alternatively, specifically, the heat dissipation module may include a metal layer covering a surface (that is, the rear side of the chip) that is of the at least one chip and that is away from the embedded package structure, and a heat sink connected to the metal layer. As metal has a strong heat transfer capability, heat of the chip can be transferred to the heat sink through the metal layer for heat dissipation.

According to a third aspect, an embodiment of this application further provides an electronic device, including a third circuit board and a power supply apparatus disposed on the third circuit board. The power supply apparatus is the power supply apparatus provided in any embodiment of the second aspect of this application. Because the power supply apparatus has the technical effect of the second aspect, the electronic device including the power supply apparatus also has better heat dissipation performance, and can significantly improve reliability and an electrical characteristic of an ECP product.

For technical effects that can be achieved in the second aspect and the third aspect, refer to the descriptions of technical effects that can be achieved in any possible design of the first aspect. Details are not described herein again.

BRIEF DESCRIPTION OF DRAWINGS

FIG. 1*a* is a schematic diagram of a structure of a power module in a conventional technology;

FIG. 1B is a schematic diagram of a structure of another power module in a conventional technology;

FIG. 2 is a schematic diagram of an embedded package structure according to an embodiment of this application;

DESCRIPTION OF EMBODIMENTS

Figure 3:
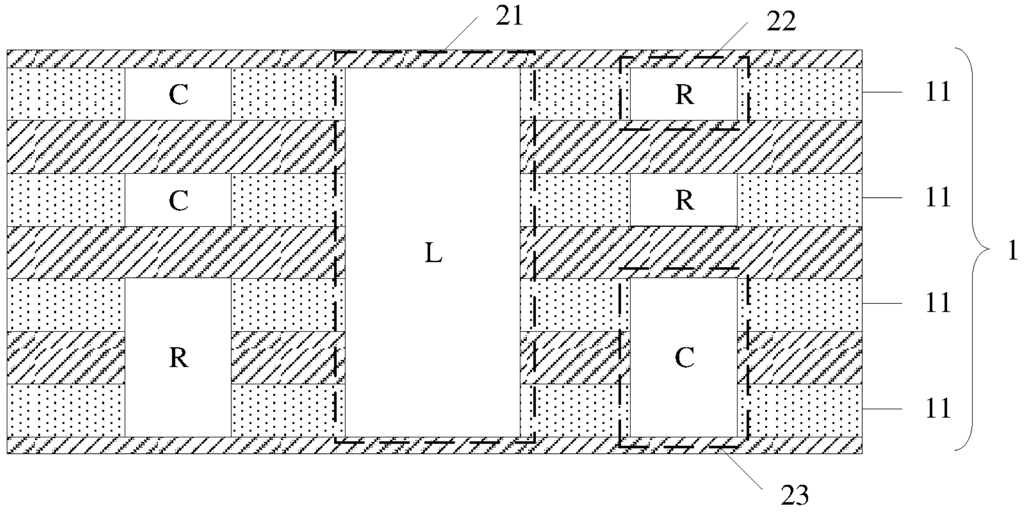
FIG. 3 is a schematic diagram of another embedded package structure according to an embodiment of this application.

To make the objectives, technical solutions, and advantages of this application clearer, the following further describes this application in detail with reference to the accompanying drawings. However, example embodiments may be implemented in a plurality of forms and should not be construed as being limited to embodiments described herein. On the contrary, these embodiments are provided such that this application is more comprehensive and complete and fully conveys the concept of the example embodiments to persons skilled in the art. Identical reference numerals in the accompanying drawings denote identical or similar structures. Therefore, repeated description thereof is omitted. Expressions of positions and directions in this application are described by using the accompanying drawings as an example. However, changes may also be made as required, and all the changes fall within the protection scope of this application. The accompanying drawings in this application are merely used to illustrate relative position relationships and do not represent an actual scale.

It should be noted that specific details are set forth in the following description to provide a thorough understanding of this application. However, this application can be implemented in numerous other manners different from those described herein, and persons skilled in the art can make similar inferences without departing from the connotation of this application. Therefore, this application is not limited to the specific implementations disclosed below. Example implementations of this application are subsequently described in the specification, but the description is intended to describe general principles of this application and is not intended to limit the scope of this application. The protection scope of this application is subject to the appended claims.

To facilitate understanding of embodiments of this application, the following first describes related technologies used in the embodiments of this application.

Refer to FIG. 1*a*. In an existing design solution of a power module, electronic components such as a chip (IC), a capacitor (C), a resistor (R), and an inductor (L) are tiled on a printed circuit board (print circuit board, PCB) for power supply and control. This type of power module occupies a quite large area of the PCB board, which is not conducive to miniaturization and integration.

Refer to FIG. 1B. In another existing design solution of a power module, a chip (IC), a capacitor (C), and a resistor (R) are embedded in a substrate to form an ECP module, and then an inductor (L) is mounted on a surface of the ECP module to construct a power module of a three-dimensional stacked structure. Such power module in which the inductor (L) is disposed in a stacked manner can reduce an occupied area to some extent, and high integration of the components can reduce a parasitic parameter. However, as a main heat source of the power module, the chip (IC) is integrated inside the ECP module, and wrapped by a dielectric layer. This causes a poor heat dissipation capability of the power module. In addition, a heat dissipation channel of the chip (IC) needs to pass through the substrate of the ECP, which also has limitation.

In view of this, an embodiment of this application provides an embedded package structure, which may be applied to a power module but is not limited to being applied to the power module.

FIG. 2 is a schematic diagram of an example of an embedded package structure according to an embodiment of this application.

Refer to FIG. 2. The embedded package structure provided in this embodiment of this application may specifically include: a substrate frame 1, an inductor component L embedded in the substrate frame 1, and a plurality of stacked first electronic components that are embedded in the substrate frame 1. The inductor component L and the plurality of stacked first electronic components may be embedded in different positions of the substrate frame 1. It may be considered that the inductor component L and the plurality of stacked first electronic components are tiled or arranged in a two-dimensional manner. A thickness of the inductor component L is generally greater than a thickness of any one of the plurality of first electronic components. The first electronic component is a passive electronic component. Any one of the plurality of first electronic components may be specifically a capacitor component C or a resistor component R.

As a power module requires a larger power supply current, a size of the inductor component L that needs to be used in the embedded package structure is also far greater than a size of the capacitor component C and a size of the resistor component R. Specifically, the thickness of the inductor component L may be greater than a thickness of another single electronic component. If the inductor component L and another electronic component are tiled in the substrate according to a conventional technology, a large area is occupied, which is not conducive to integration and miniaturization design. Therefore, in the embedded package structure provided in this application, the first electronic components with smaller sizes are stacked, and then arranged in the substrate frame 1 in a two-dimensional manner with the inductor component L with a larger size. Alternatively, it may be considered that the stacked first electronic components with small sizes are placed in a gap of the inductor component L with a larger size. This can reduce an area occupied by the entire embedded package structure, and reduce an overall size of the structure, thereby facilitating integration and miniaturization.

In this embodiment of this application, the embedded package structure may include one or more capacitor components C and one or more resistor components R, or the embedded package structure may include only a plurality of capacitor components C, or the embedded package structure may include only a plurality of resistor components R. This is not limited herein.

In this embodiment of this application, there may be a plurality of component groups in the embedded package structure. One component group includes a group of a plurality of stacked first electronic components. Projections in a horizontal direction of the first electronic components included in the component group overlap with each other. FIG. 2 shows two component groups respectively located on two sides of the inductor component L. During actual application, a quantity and a position of the component group are not limited. In addition, the plurality of stacked first electronic components in one component group may be of a same type, for example, a plurality of resistor components R may be stacked to form one component group. Alternatively, the plurality of stacked first electronic components in one component group may be of different types. For example, refer to FIG. 2. Two capacitor components C and two resistor components R may be stacked to form one component group.

Refer to FIG. 2. In some embodiments of this application, the substrate frame 1 may specifically include a plurality of stacked line layers 11. In other words, the substrate frame 1 may be formed by stacking the plurality of line layers 11. A dielectric layer may be disposed between adjacent line layers 11. Each line layer 11 may have a same thickness as or different thickness from another line layer. This is not limited herein. A circuit trace may be provided on the line layer 11, and some circuit traces may be connected to the first electronic component. Through the line layer 11, a quantity of external trace layers of the embedded package structure may be reduced, thereby reducing an overall height of the power module. The plurality of stacked line layers 11 may have first through holes 21 that penetrate all the line layers 11, and the inductor component L may be embedded in the first through holes 21. The plurality of stacked line layers 11 may further have a second through hole 22 that penetrates one line layer 11. The plurality of stacked first electronic components may include a first-size electronic component, and the first-size electronic component is embedded in the second through hole 22. The first-size electronic component refers to a first electronic component whose thickness roughly matches a thickness of a line layer 11 in which the first-size electronic component is to be embedded, so that the first-size electronic component can be embedded in the second through hole 22 in the single line layer. The first-size electronic component may be specifically a resistor component R or a capacitor component C. This is not limited herein. A quantity of line layers 11 included in the substrate frame 1 is determined by the thickness of the inductor component L. In other words, a total thickness of the stacked line layers 11 is generally approximately equal to the thickness of the inductor component L. A total thickness of a third through hole in which a plurality of first electronic components are stacked in one component group may also be approximately equal to the thickness of the inductor component L. FIG. 2 shows a case in which the substrate frame 1 includes four stacked line layers 11, where the first through hole 21 for embedding the inductor component L penetrates the four line layers 11, two second through holes 22 are disposed in each line layer 11, and a capacitor component C or a resistor component R is embedded in each through hole 22.

FIG. 3 is a schematic diagram of an example of another embedded package structure according to an embodiment of this application.

Refer to FIG. 3. In some other embodiments of this application, the plurality of stacked lines 11 may further have a third through hole 23 that penetrates at least two adjacent line layers 11. The plurality of stacked first electronic components may further include a second-size electronic component, the second-size electronic component may be embedded in the third through hole 23, and a thickness of the second-size electronic component is greater than a thickness of the first-size electronic component. According to an actual design requirement, in the embedded package structure, the first electronic components may have different sizes. For example, capacitor components C of different sizes and resistor components R of different sizes may exist. A first electronic component of a larger size may be the second-size electronic component. A second through hole 22 using a single line layer cannot be embedded with the second-size electronic component. Therefore, a third through hole 23 that penetrates a plurality of line layers 11 may be provided. For example, refer to FIG. 3. A third through hole 23 that penetrates two line layers 11 may be provided, and a capacitor component C and a resistor component R of relatively large sizes may be embedded in the third through hole 23. In this way, in the embedded package structure, depending on different sizes of the disposed first electronic components, there may be a component group including three stacked first electronic components, or there may be a component group including four stacked first electronic components. A larger thickness of the first electronic component indicates a larger quantity of line layers 11 penetrated by the third through hole 23 for embedding a component, and a smaller quantity of first electronic components included in the component group.

Figure 4:
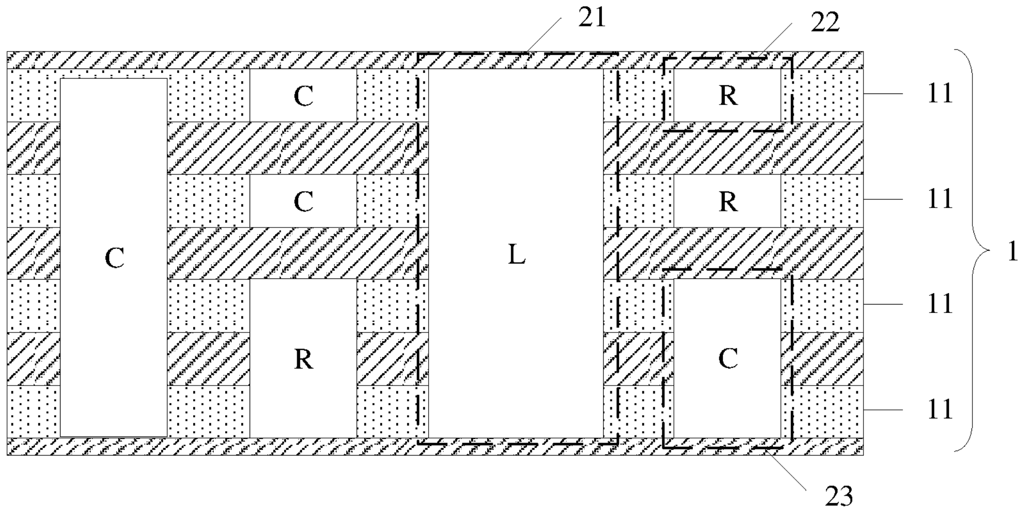
FIG. 4 is a schematic diagram of still another embedded package structure according to an embodiment of this application.

FIG. 4 is a schematic diagram of an example of still another embedded package structure according to an embodiment of this application.

Refer to FIG. 4. In some other embodiments of this application, in the embedded package structure, there may also be a first electronic component, for example, a large-sized capacitor component C, whose thickness is close to the thickness of the inductor component L. The capacitor component C is directly embedded in the substrate frame 1 and is not stacked with another first electronic component.

Figure 5:
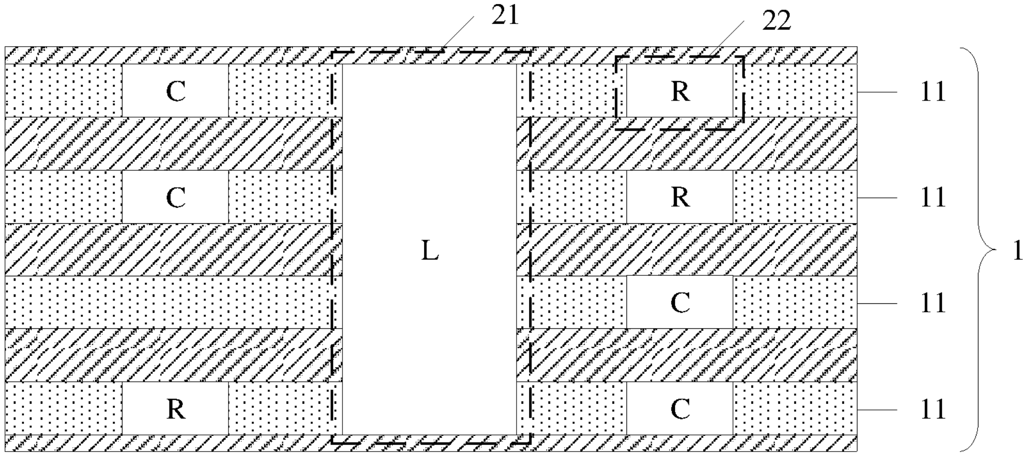
FIG. 5 is a schematic diagram of yet another embedded package structure according to an embodiment of this application.

FIG. 5 is a schematic diagram of an example of yet another embedded package structure according to an embodiment of this application.

Refer to FIG. 2 to FIG. 4. In some embodiments of this application, to maximally integrate electronic components, a second through hole 22 or a third through hole 23 may be disposed at a same position in a vertical direction on the line layers 11, so that a maximal quantity of first electronic components are stacked in the component group. Alternatively, refer to FIG. 5. In some other embodiments of this application, the second through hole 22 or the third through hole 23 may not be disposed at a specific position of a line layer 11, that is, no first electronic component is embedded in a line layer 11 in the component group. Some signal interference may be shielded through the line layer 11. For example, the second through hole 22 is not disposed in a second line layer 11 in the component group on the left in FIG. 5.

Figure 6:
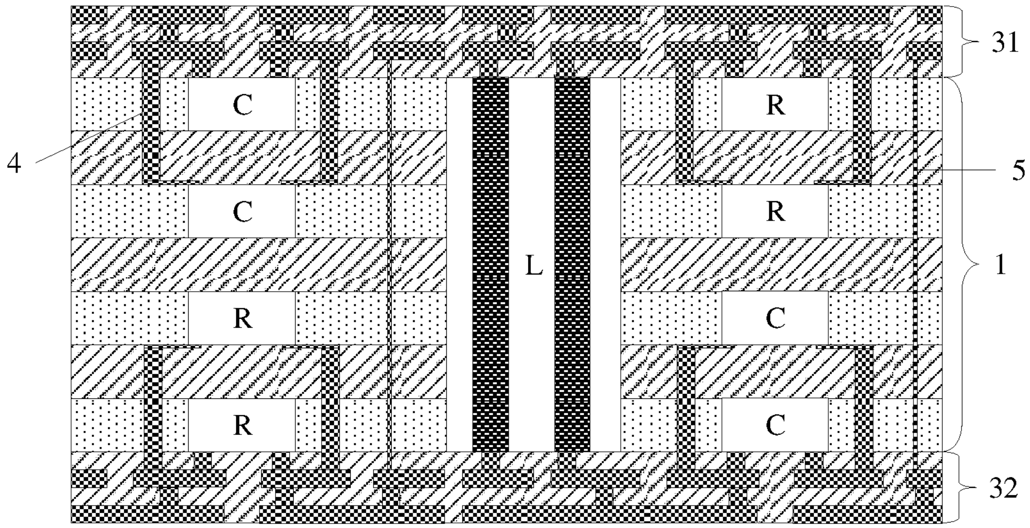
FIG. 6 is a schematic diagram of still yet another embedded package structure according to an embodiment of this application.

FIG. 6 is a schematic diagram of an example of still yet another embedded package structure according to an embodiment of this application.

Refer to FIG. 6. In some embodiments of this application, the embedded package structure may further include a first interconnect line layer 31 located on the substrate frame 1, and a second interconnect line layer 32 located on a side that is of the substrate frame 1 and that is away from the first interconnect line layer 31. During specific implementation, the first interconnect line layer 31 and the second interconnect line layer 32 each may include at least one conductive layer, and a circuit trace is provided on the conductive layer. When the first interconnect line layer 31 and the second interconnect line layer 32 each include two or more conductive layers, an insulation dielectric layer is further provided between adjacent conductive layers. A medium via is provided in the insulation dielectric layer to connect circuit traces on the different conductive layers. It should be noted that, a quantity of conductive layers included in each of the first interconnect line layer 31 and the second interconnect line layer 32 is not limited in this application, and may be designed based on an actual requirement. FIG. 6 is described by merely using an example in which the first interconnect line layer 31 and the second interconnect line layer 32 each include two conductive layers.

Refer to FIG. 6. In some embodiments of this application, blind vias 5 that penetrate all the line layers 11 may be provided in the substrate frame 1. Conduction of the first interconnect line layer 31 and the second interconnect line layer 32 may be implemented through the blind vias 5.

In this embodiment of this application, through the first interconnect line layer 31 and the second interconnect line layer 32, the inductor component L and the first electronic components embedded in the substrate frame 1 may be led out and connected to components located outside the embedded package structure.

Specifically, one end of a winding of the inductor component L embedded in the substrate frame 1 may be electrically connected to the first interconnect line layer 31, and the other end of the winding of the inductor component L may be electrically connected to the second interconnect line layer 32. FIG. 6 shows a case in which two vertical windings are disposed in the inductor component L. The winding of the inductor component L is directly conducted with the first interconnect line layer 31 and the second interconnect line layer 32, so that a current flowing through the inductor component L can directly flow from top to bottom through the winding, and a current path is perpendicular to the substrate frame 1. This greatly shortens the current path.

Specifically, in the plurality of stacked first electronic components, a first electronic component stacked on a top layer may be directly electrically connected to the first interconnect line layer 31, a first electronic component stacked on a bottom layer may be directly electrically connected to the second interconnect line layer 32, and a first electronic component stacked on a middle layer may be electrically connected to the first interconnect line layer 31 or the second interconnect line layer 32 through a vertical interconnect component 4. The vertical interconnect component may be a copper column, or may be another connecting component, which is not limited herein. For example, in a component group on the left of FIG. 6, a middle capacitor component C may be electrically connected to the first interconnect line layer 31 through a vertical interconnect component 4, and a middle resistor component R may be electrically connected to the second interconnect line layer 32 through a vertical interconnect component 4, or vice versa.

In some other embodiments of this application, in the plurality of stacked first electronic components, all the first electronic components may be electrically connected to the first interconnect line layer 31 through different vertical interconnect components, or all the first electronic components may be electrically connected to the second interconnect line layer 32 through different vertical interconnect components.

The embedded package structure provided in this application may be applied to a power module. Based on this, an embodiment of this application further provides a power supply apparatus, and the power supply apparatus may include the embedded package structure provided in the foregoing embodiment of this application.

Figure 7:
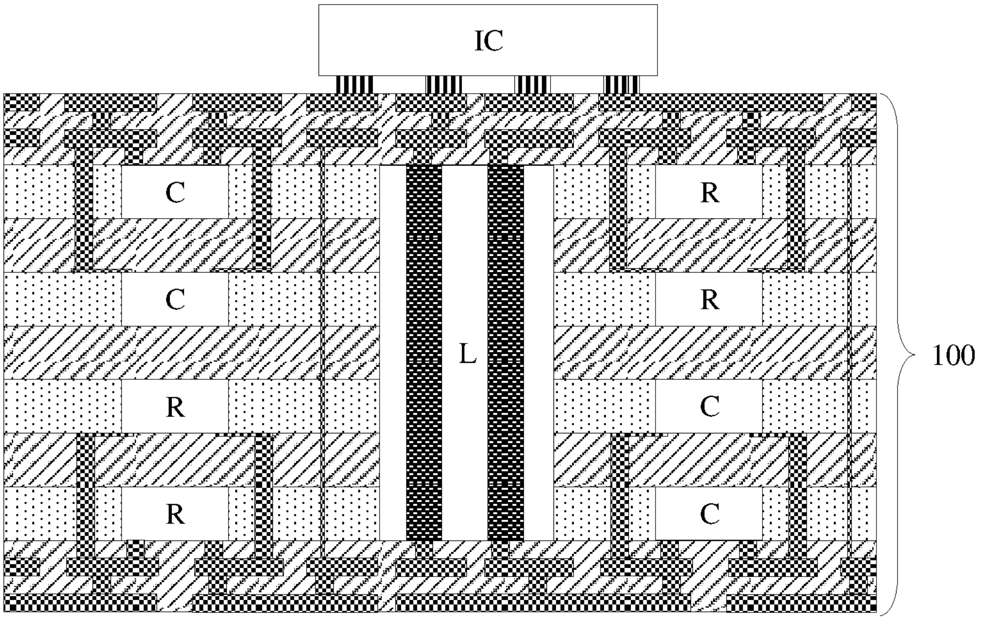
FIG. 7 is a schematic diagram of a structure of a power supply apparatus according to an embodiment of this application.

FIG. 7 is a schematic diagram of an example structure of a power supply apparatus according to an embodiment of this application.

Refer to FIG. 7. The power supply apparatus provided in this embodiment of this application may specifically include an embedded package structure 100 and at least one second electronic component located on the embedded package structure 100. The at least one second electronic component may include at least one chip IC. In the power supply apparatus provided in this embodiment of this application, an inductor component, a capacitor component, and a resistor component are embedded in the embedded package structure 100. Then, the chip IC is disposed on the embedded package structure 100, so that the chip IC serving as a main heat source is placed on a surface of the power supply apparatus. Compared with an existing power module structure in which a chip IC is embedded in a substrate to form an ECP module and an inductor (L) is mounted on a surface of the ECP module, in the embedded package structure provided in this application, a main heat dissipation path of the chip IC is changed from an existing downward heat dissipation direction to an upward heat dissipation direction, which may improve a heat dissipation capability.

Figure 8:
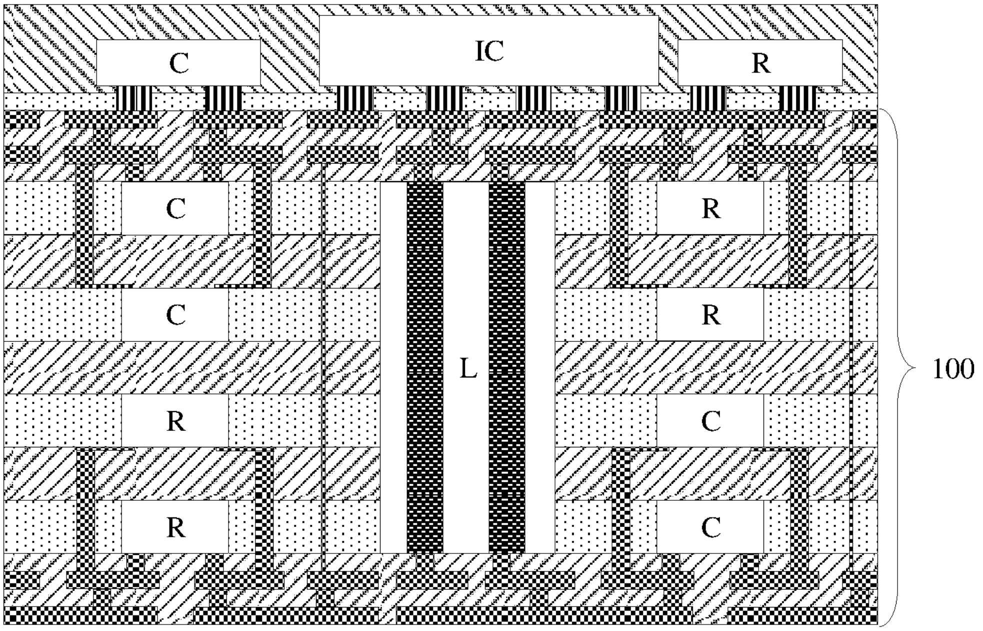
FIG. 8 is a schematic diagram of a structure of another power supply apparatus according to an embodiment of this application.

FIG. 8 is a schematic diagram of an example structure of another power supply apparatus according to an embodiment of this application.

Refer to FIG. 8. In some embodiments of this application, the at least one second electronic component may further include at least one capacitor component C and/or at least one resistor component R. The chip IC, the capacitor component C, and the resistor component R that are used as the second electronic components may alternatively be tiled on a surface of the embedded package structure, rather than be stacked.

In this application, the second electronic component may be connected to the embedded package structure 100 in a plurality of manners.

Refer to FIG. 8. In some embodiments of this application, the at least one second electronic component may be packaged on the embedded package structure 100. For example, the chip IC may be directly flip-packaged (FC) on the first interconnect line layer 31 of the embedded package structure 100. Refer to FIG. 8. When there are a plurality of second electronic components, the second electronic components may be uniformly plastic-packaged. For example, the chip IC, the capacitor component C, and the resistor component R in FIG. 8 may be uniformly plastic-packaged.

Figure 9:
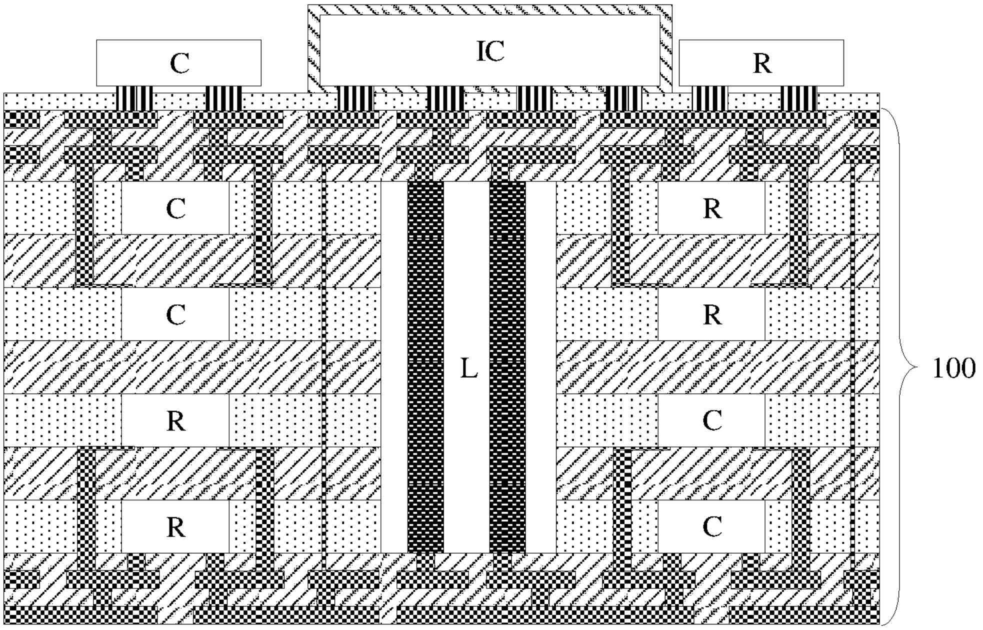
FIG. 9 is a schematic diagram of a structure of still another power supply apparatus according to an embodiment of this application.

FIG. 9 is a schematic diagram of an example structure of still another power supply apparatus according to an embodiment of this application.

Refer to FIG. 9. In some other embodiments of this application, when there are a plurality of second electronic components, the second electronic components may alternatively be independently plastic-packaged, for example, the chip IC in FIG. 9 is independently plastic-packaged.

Figure 10:
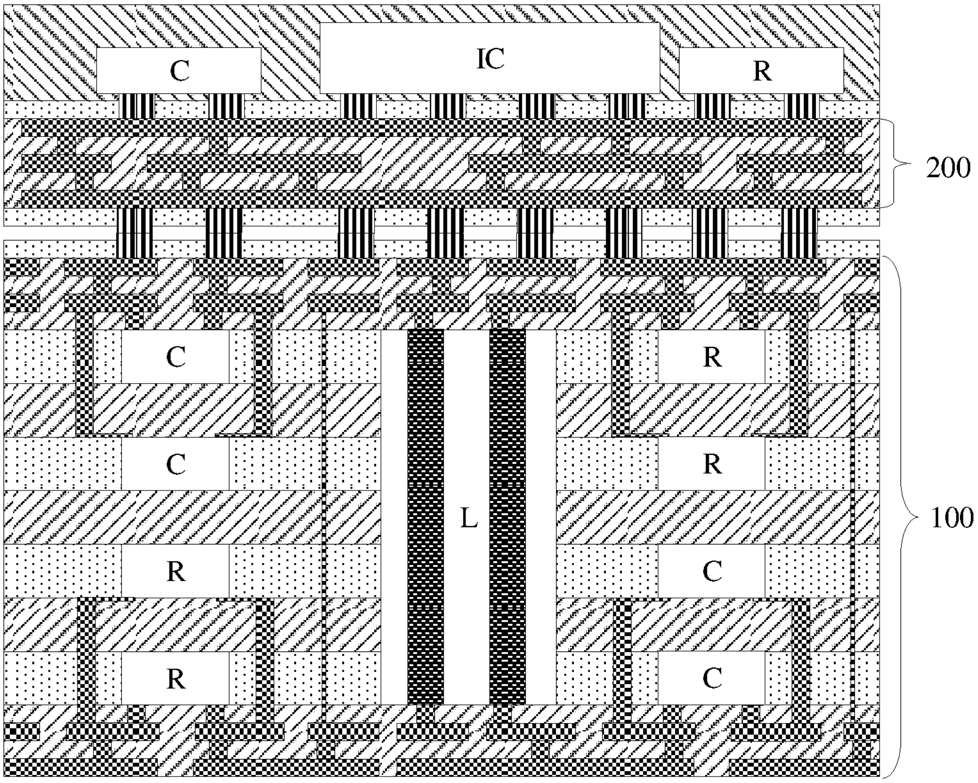
FIG. 10 is a schematic diagram of a structure of yet another power supply apparatus according to an embodiment of this application.

FIG. 10 is a schematic diagram of an example structure of yet another power supply apparatus according to an embodiment of this application.

Refer to FIG. 10. In some other embodiments of this application, the at least one second electronic component may be first packaged on a first circuit board 200, and then the first circuit board 200 is electrically connected to the embedded package structure 100.

Figure 11:
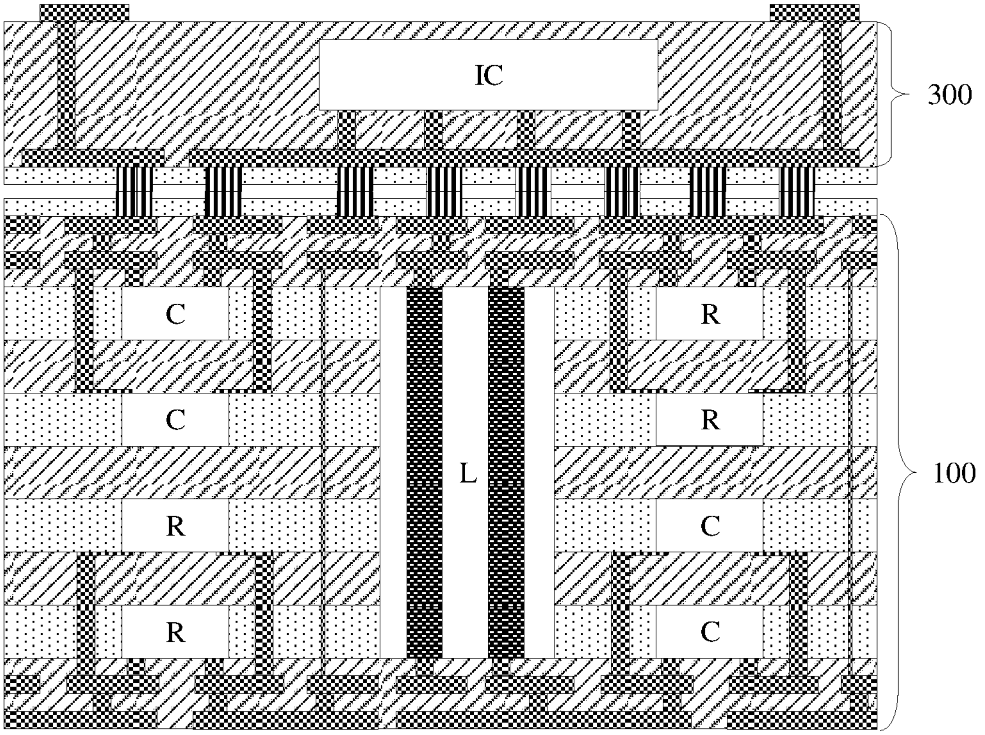
FIG. 11 is a schematic diagram of a structure of still yet another power supply apparatus according to an embodiment of this application.

FIG. 11 is a schematic diagram of an example structure of still yet another power supply apparatus according to an embodiment of this application.

Refer to FIG. 11. In some other embodiments of this application, the at least one second electronic component may be embedded in a second circuit board 300 to form another embedded package structure, and then the second circuit board 300 is electrically connected to the embedded package structure 100, that is, two ECP structures are interconnected.

Figure 12:
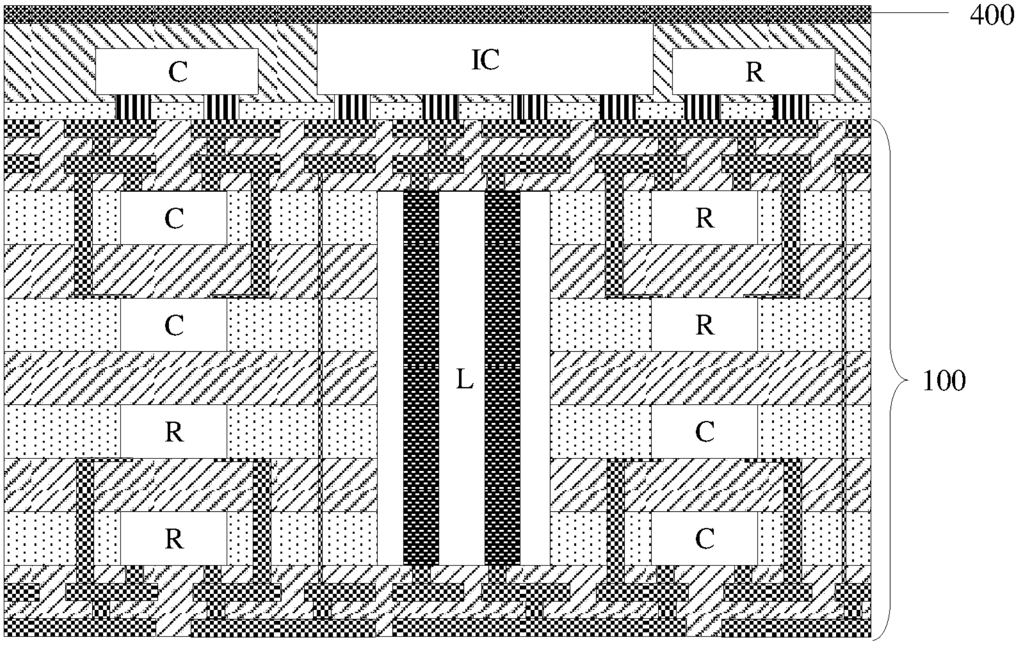
FIG. 12 is a schematic diagram of a structure of a further power supply apparatus according to an embodiment of this application.
Figure 13:
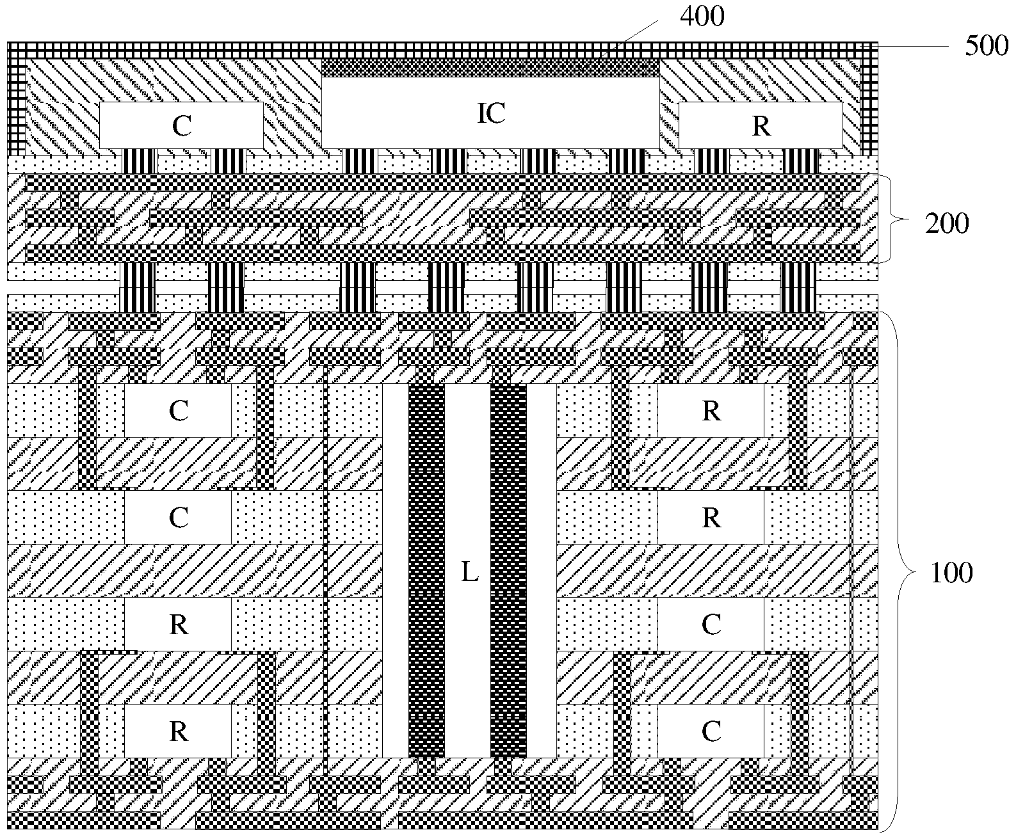
FIG. 13 is a schematic diagram of a structure of a still further power supply apparatus according to an embodiment of this application.
Figure 14:
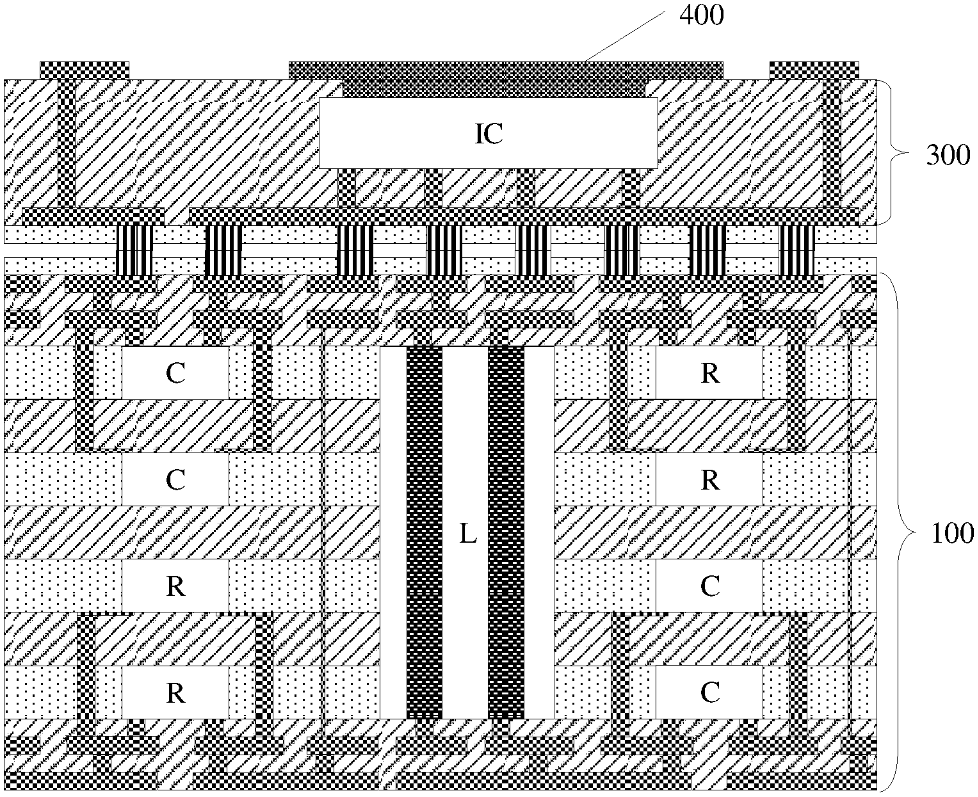
FIG. 14 is a schematic diagram of a structure of a yet further power supply apparatus according to an embodiment of this application.

FIG. 12 is a schematic diagram of an example structure of a further power supply apparatus according to an embodiment of this application. FIG. 13 is a schematic diagram of an example structure of a still further power supply apparatus according to an embodiment of this application. FIG. 14 is a schematic diagram of an example structure of a yet further power supply apparatus according to an embodiment of this application.

Refer to FIG. 12 to FIG. 14. In some embodiments of this application, a heat dissipation module may be further disposed on a surface that is of the at least one chip IC and that is away from the embedded package structure 100, namely, a rear side of the chip IC. The rear side of the chip IC is connected to the heat dissipation module. Because an area of the chip IC occupies only 30% to 40% of an area of a voltage apparatus, if heat is dissipated only through an exposed part on the rear side of the chip IC, a heat dissipation capability is limited. Therefore, the heat dissipation module is disposed to expand a heat dissipation area and improve the heat dissipation capability.

Specifically, refer to FIG. 12 and FIG. 13. The heat dissipation module may be a metal layer 400 covering a packaging surface of the at least one second electronic component. An area of the metal layer 400 is far greater than a surface area of the rear side of the chip IC. Therefore, a heat dissipation area is expanded, and the heat dissipation capability is improved.

Specifically, refer to FIG. 14. The heat dissipation module may include a metal layer 400 covering a surface (that is, the rear side of the chip IC) that is of the at least one chip IC and that is away from the embedded package structure 100, and a heat sink 500 connected to the metal layer 400. As metal has a strong heat transfer capability, heat of the chip IC may be transferred to the heat sink 500 through the metal layer 400 for heat dissipation.

Figure 15:
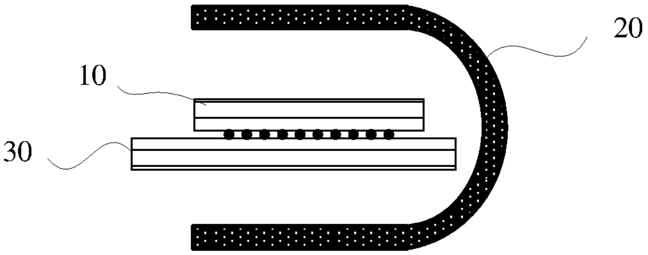
FIG. 15 is a schematic diagram of a structure of an electronic device according to an embodiment of this application.

The power supply apparatus provided in embodiments of this application may be applied to various electronic devices, such as a smartphone, a smart television, a smart television set top box, a personal computer (personal computer, PC), a wearable device, and a smart broadband. It should be noted that the power supply apparatus provided in embodiments of this application is intended to include but is not limited to being applied to these electronic devices and any electronic device of another proper type. Refer to FIG. 15. A mobile phone is used as an example. The electronic device includes a housing 20 and a third circuit board disposed in the housing 20, where a power supply apparatus 10 is disposed on the third circuit board. The third circuit board may be a mainboard 30 of the electronic device, and the power supply apparatus 10 is electrically connected to the mainboard 30.

It is clear that, persons skilled in the art can make various modifications and variations to the present invention without departing from the spirit and scope of the present invention. The present invention is intended to cover these modifications and variations provided that they fall within the protection scope defined by the claims of the present invention and equivalent technologies.

What is claimed is:

1. An embedded package structure, comprising:

a substrate frame, an inductor component embedded in the substrate frame, and a plurality of stacked first electronic components embedded in the substrate frame, wherein the inductor component and the plurality of stacked first electronic components are embedded in different positions of the substrate frame, wherein a thickness of the inductor component is greater than a respective thickness of any one of the plurality of stacked first electronic components, wherein each electronic component of the plurality of stacked first electronic components is a respective capacitor component or a respective resistor component, and wherein the plurality of stacked first electronic components includes at least one capacitor component and at least one resistor component.

2. The embedded package structure according to claim 1, wherein the substrate frame includes a plurality of stacked line layers, wherein the plurality of stacked line layers includes first through holes that penetrate all of the plurality of stacked line layers, and the inductor component is embedded in the first through holes, and wherein the plurality of stacked line layers further includes a second through hole that penetrates one line layer of the plurality of stacked line layers, the plurality of stacked first electronic components comprises a first-size electronic component, and the first-size electronic component is embedded in the second through hole.

3. The embedded package structure according to claim 2, wherein the plurality of stacked line layers further includes a third through hole that penetrates at least two adjacent line layers of the plurality of stacked line layers, and wherein the plurality of stacked first electronic components further comprises a second-size electronic component, the second-size electronic component is embedded in the third through hole, and a second thickness of the second-size electronic component is greater than a first thickness of the first-size electronic component.

4. The embedded package structure according to claim 1, further comprising:

a first interconnect line layer and a second interconnect line layer, wherein the first interconnect line layer is located on the substrate frame, and the second interconnect line layer is located on a side of the substrate frame away from the first interconnect line layer, and wherein a first end of a winding of the inductor component is electrically connected to the first interconnect line layer, and a second end of the winding of the inductor component is electrically connected to the second interconnect line layer.

5. The embedded package structure according to claim 2, further comprising:

a first interconnect line layer and a second interconnect line layer, wherein the first interconnect line layer is located on the substrate frame, and the second interconnect line layer is located on a side of the substrate frame away from the first interconnect line layer, and wherein a first end of a winding of the inductor component is electrically connected to the first interconnect line layer, and a second end of the winding of the inductor component is electrically connected to the second interconnect line layer.

6. The embedded package structure according to claim 3, further comprising:

a first interconnect line layer and a second interconnect line layer, wherein the first interconnect line layer is located on the substrate frame, and the second interconnect line layer is located on a side of the substrate frame away from the first interconnect line layer, and wherein a first end of a winding of the inductor component is electrically connected to the first interconnect line layer, and a second end of the winding of the inductor component is electrically connected to the second interconnect line layer.

7. The embedded package structure according to claim 4, wherein in the plurality of stacked first electronic components, a first electronic component stacked on a top layer is electrically connected to the first interconnect line layer, a second electronic component stacked on a bottom layer is electrically connected to the second interconnect line layer, and a third electronic component stacked on a middle layer is electrically connected to the first interconnect line layer or the second interconnect line layer through a vertical interconnect component.

8. A power supply apparatus, comprising:

an embedded package structure and at least one second electronic component located on the embedded package structure, wherein the embedded package structure comprises a substrate frame, an inductor component embedded in the substrate frame, and a plurality of stacked first electronic components embedded in the substrate frame, wherein the inductor component and the plurality of stacked first electronic components are embedded in different positions of the substrate frame, wherein a thickness of the inductor component is greater than a respective thickness of any one of the plurality of stacked first electronic components, wherein each electronic component of the plurality of stacked first electronic components is a respective capacitor component or a respective resistor component, wherein the plurality of stacked first electronic components includes at least one capacitor component and at least one resistor component, and wherein the at least one second electronic component comprises at least one chip.

9. The power supply apparatus according to claim 8, wherein the at least one second electronic component is packaged on the embedded package structure.

10. The power supply apparatus according to claim 8, wherein the at least one second electronic component is packaged on a first circuit board, and the first circuit board is electrically connected to the embedded package structure.

11. The power supply apparatus according to claim 8, wherein the at least one second electronic component is embedded in a second circuit board, and the second circuit board is electrically connected to the embedded package structure.

12. The power supply apparatus according to claim 8, wherein the at least one second electronic component further comprises second at least one capacitor component or second at least one resistor component.

13. The power supply apparatus according to claim 8, further comprising:

a heat dissipation module, wherein a surface of the at least one chip and away from the embedded package structure is connected to the heat dissipation module.

14. The power supply apparatus according to claim 13, wherein the heat dissipation module is a first metal layer covering a packaging surface of the at least one second electronic component, or wherein the heat dissipation module comprises a second metal layer covering the surface of the at least one chip and away from the embedded package structure, and the heat dissipation module further comprises a heat sink connected to the second metal layer.

15. The power supply apparatus according to claim 8, wherein the substrate frame includes a plurality of stacked line layers, wherein the plurality of stacked line layers includes first through holes that penetrate all of the plurality of stacked line layers, and the inductor component is embedded in the first through holes, and wherein the plurality of stacked line layers further includes a second through hole that penetrates one line layer of the plurality of stacked line layers, the plurality of stacked first electronic components comprises a first-size electronic component, and the first-size electronic component is embedded in the second through hole.

16. The power supply apparatus according to claim 15, wherein the plurality of stacked line layers further includes a third through hole that penetrates at least two adjacent line layers of the plurality of stacked line layers, and wherein the plurality of stacked first electronic components further comprises a second-size electronic component, the second-size electronic component is embedded in the third through hole, and a second thickness of the second-size electronic component is greater than a first thickness of the first-size electronic component.

17. The power supply apparatus according to claim 8, further comprising:

a first interconnect line layer and a second interconnect line layer, wherein the first interconnect line layer is located on the substrate frame, and the second interconnect line layer is located on a side of the substrate frame away from the first interconnect line layer, and wherein a first end of a winding of the inductor component is electrically connected to the first interconnect line layer, and a second end of the winding of the inductor component is electrically connected to the second interconnect line layer.

18. The power supply apparatus according to claim 15, further comprising:

a first interconnect line layer and a second interconnect line layer, wherein the first interconnect line layer is located on the substrate frame, and the second interconnect line layer is located on a side of the substrate frame away from the first interconnect line layer, and wherein a first end of a winding of the inductor component is electrically connected to the first interconnect line layer, and a second end of the winding of the inductor component is electrically connected to the second interconnect line layer.

19. The power supply apparatus according to claim 16, further comprising:

a first interconnect line layer and a second interconnect line layer, wherein the first interconnect line layer is located on the substrate frame, and the second interconnect line layer is located on a side of the substrate frame away from the first interconnect line layer, and wherein a first end of a winding of the inductor component is electrically connected to the first interconnect line layer, and a second end of the winding of the inductor component is electrically connected to the second interconnect line layer.

* * * * *